US008633692B2

(12) United States Patent
Strobel et al.

(10) Patent No.: US 8,633,692 B2
(45) Date of Patent: Jan. 21, 2014

(54) HIGH FIELD NMR APPARATUS WITH EXCESS COOLING POWER AND INTEGRATED HELIUM RE-LIQUIFICATION

(75) Inventors: Marco Strobel, Karlsruhe (DE); Holger Liebel, Hoerdt (DE)

(73) Assignee: Bruker BioSpin GmbH, Rheinstetten (DE)

( * ) Notice: Subject to any disclaimer, the term of this patent is extended or adjusted under 35 U.S.C. 154(b) by 354 days.

(21) Appl. No.: 13/137,185

(22) Filed: Jul. 27, 2011

(65) Prior Publication Data

US 2012/0025821 A1 Feb. 2, 2012

(30) Foreign Application Priority Data

Jul. 30, 2010 (DE) .......................... 10 2010 038 713

(51) Int. Cl.
*G01V 3/00* (2006.01)
(52) U.S. Cl.
USPC .......................................................... 324/307
(58) Field of Classification Search
USPC ................................................. 324/300–322
See application file for complete search history.

(56) References Cited

U.S. PATENT DOCUMENTS

| | | | |
|---|---|---|---|
| 4,766,741 A | | 8/1988 | Bartlett |
| 5,410,286 A | * | 4/1995 | Herd et al. .................... 335/216 |
| 5,744,959 A | * | 4/1998 | Jeker et al. ................... 324/319 |
| 5,966,944 A | * | 10/1999 | Inoue et al. .................... 62/51.1 |
| 6,029,458 A | | 2/2000 | Eckels |
| 6,378,312 B1 | * | 4/2002 | Wang ................................. 62/6 |
| 6,629,418 B1 | * | 10/2003 | Gao et al. ............................ 62/6 |
| 6,828,889 B1 | | 12/2004 | Zaput |

(Continued)

FOREIGN PATENT DOCUMENTS

| | | |
|---|---|---|
| DE | 10 2008 013 616 | 9/2009 |
| JP | 2005224441 | 8/2005 |

OTHER PUBLICATIONS

Yuri Lvovsky and Peter Jarvis "Superconducting Systems for MRI—Present Solutions and New Trends", IEEE transactions on applied superconductivity, vol. 15, No. 2, Jun. 2005.

(Continued)

Primary Examiner — Dixomara Vargas
(74) Attorney, Agent, or Firm — Paul Vincent

(57) ABSTRACT

A nuclear magnetic resonance (NMR) apparatus (10) comprises a superconducting main field magnet coil system (14) which generates a homogeneous magnetic field of at least 3T, and a gradient coil system (15) which generates a gradient strength of at least 10 mTm$^{-1}$, with a slew rate of at least 100 Tm$^{-1}$s$^{-1}$, wherein the main field magnet coil system (14) is arranged in a cryostat (12) with liquid helium and a refrigerator (16) in the form of a pulse tube cooler or a Gifford-McMahon cooler, and wherein an evaporation line (17a, 27a, 37a) is provided for helium that might evaporate from the cryostat. In all states of operation of the NMR apparatus (10) without gradient switching, the refrigerator provides a cooling capacity which is at least 0.3 W above the overall power loss of the cryostat, the evaporation line terminates in a buffer container (19, 29, 39, 39') disposed outside of the cryostat for collecting the evaporating helium, and a return line (17b, 27b, 37b) is provided for returning the evaporated helium that has been collected in the buffer container into the cryostat. For this reason, a considerable amount of evaporating helium is saved, thereby considerably extending the refill cycles of liquid helium, which greatly disturb and obstruct normal work cycles and are disadvantageous for operation, in particular, in hospitals.

17 Claims, 3 Drawing Sheets

(56) References Cited

U.S. PATENT DOCUMENTS

| | | | |
|---|---|---|---|
| 7,024,867 B2* | 4/2006 | Arman et al. | 62/6 |
| 7,114,341 B2* | 10/2006 | Gao | 62/6 |
| 7,404,295 B2* | 7/2008 | Li et al. | 62/6 |
| 7,498,814 B1* | 3/2009 | Huang et al. | 324/318 |
| 7,692,426 B2 | 4/2010 | Dietz | |
| 7,719,160 B2* | 5/2010 | Koizumi et al. | 310/266 |
| 8,053,946 B2* | 11/2011 | Koizumi et al. | 310/266 |
| 8,072,219 B2* | 12/2011 | Saito et al. | 324/318 |
| 8,499,568 B2* | 8/2013 | Mingyao | 62/6 |
| 2006/0055406 A1* | 3/2006 | Lvovsky et al. | 324/318 |
| 2006/0064989 A1 | 3/2006 | Roth | |
| 2006/0096301 A1 | 5/2006 | Triebe | |
| 2008/0157771 A1 | 7/2008 | Westphal | |
| 2009/0158752 A1* | 6/2009 | Clayton et al. | 62/6 |
| 2009/0280989 A1 | 11/2009 | Astra | |
| 2009/0301129 A1 | 12/2009 | Wang | |

OTHER PUBLICATIONS

G. Morrow "Progress in MRI Magnets", IEEE transactions on applied superconductivity, vol. 10, No. 1, Mar. 2000.

Robert A. Ackermann and Kennth G. Herd "Advanced Cryocooler Cooling for MRI Systems", Ccryocoolers 10, edited by J.G. Ross, Jr. Kluwer Academic/Plenum Publishers, 1999.

Martin Rausch, et al. "Computer-Aided Design of Clinical Magnetic Resonance Imaging Scanners by Coupled Magnetomechanical-Acoustic Modeling", IEEE transactions on magnetics, vol. 41, No. 1, Jan. 2005.

Yuri Lvovsky et al., "Superconducting Systems for MRI—Present Solutions and New Trends", IEEE transactions on applied superconductivity; vol. 15, No. 2, Jun. 2005.

* cited by examiner

HIGH FIELD NMR APPARATUS WITH EXCESS COOLING POWER AND INTEGRATED HELIUM RE-LIQUIFICATION This application claims Paris Convention priority of DE 10 2010 038 713.4 filed Jul. 30, 2010 the complete disclosure of which is hereby incorporated by reference.

BACKGROUND OF THE INVENTION

The invention concerns a nuclear magnetic resonance (NMR) apparatus comprising a superconducting main field magnet coil system which generates a homogeneous magnetic field of at least 3T, and a gradient coil system which generates a gradient strength of at least $10\ mTm^{-1}$, with a slew rate of at least $100\ Tm^{-1}s^{-1}$, wherein the main field magnet coil system is arranged in a cryostat with liquid helium having a refrigerator in the form of a pulse tube cooler or a Gifford-McMahon cooler, wherein an evaporation line is provided for helium that evaporates from the cryostat.

An apparatus of this type is disclosed in a publication by Lvovsky and Peter Jarvis [1].

Superconduction technology is used for generating strong magnetic fields in an economical fashion. Superconductors are energized at very low temperatures in order to be able to utilize the effect of resistance-free current conduction, and subsequently generate the corresponding magnetic field.

The superconductor is cooled by evaporation of liquid helium. For economic reasons, these evaporation rates must be minimized [2, 3, 5].

Accordingly, many NMR apparatus (cryostats) that are currently on the market have refrigerators [4].

In recent years, the technology has reached a state which permits re-liquifying of the helium that has evaporated in the quiescent state of the system (no switching of gradients). These systems are designated as so-called zero boil-off systems.

As is disclosed e.g. in [6, 7, 8], vibrations and eddy currents are generated in an NMR apparatus due to rapid switching of gradient fields, which then result in a considerably increased helium evaporation rate. This considerably shortens the refill cycles, thereby extending the downtimes of the system and reducing the effective useful life. The evaporating helium is usually simply introduced into the atmosphere or, in rare cases, also condensed and filled into gas bottles and moved from there to industrial scale plants where the gas is re-liquified. Helium is available on the earth only in limited amounts and for this reason, this resource must be handled economically. Introduction of the helium gas into the atmosphere does certainly not meet this objective. When the outflowing gas is condensed and re-liquified in industrial scale plants, the above-mentioned objective is met. This is, however, accompanied by substantial logistic expense.

It is therefore the object of the invention to provide a high field NMR apparatus, which saves considerable amounts of evaporated helium, thereby considerably extending the liquid helium refill cycles which greatly disturb and obstruct normal work cycles and are disadvantageous for operation, in particular, in hospitals.

SUMMARY OF THE INVENTION

This object is achieved by the invention in a surprisingly simple and also effective fashion in that in all states of operation of the NMR apparatus without gradient switching, the refrigerator provides a cooling capacity which is at least 0.3 W above the overall power loss (thermal input) of the cryostat, the evaporation line terminates in a buffer container disposed outside of the cryostat for collecting the evaporating helium, and a return line is provided for returning the evaporated helium, which has been collected in the buffer container, into the cryostat.

This invention reduces the helium consumption and thereby the number of refill cycles compared to conventional methods. It increases the profitability and also ensures more careful handling of the rare helium resources.

In one preferred embodiment of the invention, at least one valve is provided for controlling the helium flow through the evaporation line and, if necessary, one valve for controlling the helium flow through the return line. This embodiment facilitates regulation of the pressure in the magnet.

The valves are advantageously designed in the form of pressure control valves that can be driven. This provides more degrees of freedom for optimizing the pressure relationships in the reservoir or in the helium tank.

A further embodiment of the invention is characterized in that the return line is identical with the evaporation line. This reduces the number of parts that are used, thereby minimizing the cost.

One embodiment of the invention is regarded as advantageous, in which the return line has an end section on the cryostat side which is in direct thermal contact with the refrigerator. This further increases the gas re-liquification efficiency.

In a further preferred embodiment, the return line has at least one filter device for segregating impurities in the helium flow. This minimizes the danger that impurities deposit in the helium tank, which could impair the operability of the NMR system.

A further embodiment is characterized in that the buffer container comprises a balloon offering for changing the internal volume.

In a further development of this embodiment, the balloon is made from elastic material.

In an alternative fashion, the balloon can be folded.

In an alternative embodiment, the buffer container comprises a gas bottle and a compressor, which provides a very large buffer volume utilizing little space.

A further embodiment of the invention is characterized in that the NMR apparatus is designed as an MRI or FTMS apparatus.

The invention also concerns a method for operating an inventive NMR apparatus, wherein, in an operating state of the NMR apparatus with gradient switching, the gradient coil system is driven in such a fashion that pulsed magnetic field gradients with repetition frequencies of at least 100 Hz, gradient strengths of at least $10\ mTm^{-1}$ and slew rates of at least $100\ Tm^{-1}s^{-1}$ are generated, which cause additional heat input into the cryostat of more than 0.3 W compared to operating states without gradient switching, and therefore cause evaporation of helium from the cryostat into the evaporation line, wherein the evaporated helium is collected and intermediately stored in the buffer container, and wherein, in a following operating state without gradient switching, helium is returned from the buffer container via the return line into the cryostat, is brought into thermal contact with the cold surfaces of the refrigerator and is thereby re-liquefied. Since the refrigerator provides a cooling capacity which is at least 0.3 W above the overall power loss (thermal input) of the cryostat without gradient switching, the refrigerator has an excess cooling capacity which is greater than or equal to the additional heat input into the cryostat caused by gradient switching. When the gradients are switched off, this excess cooling capacity is available for liquefying the helium stored in the buffer container.

In one variant of this method, the valve in the evaporation line is opened when a first limit pressure p1 in the cryostat is exceeded and is closed again when a second limit pressure $p2 \leq p1$ is fallen below.

In one further variant of the method, EPI-, RARE- or FLASH-sequences are generated in an operating state with gradient switching.

Further advantages of the invention can be extracted from the description and the drawing. The features mentioned above and below may be used individually or collectively in arbitrary combination. The embodiments shown and described are not to be taken as exhaustive enumeration but have exemplary character for describing the invention.

DESCRIPTION OF THE PREFERRED EMBODIMENT

Detailed Description of the Illustrated Embodiments

Figure 1:
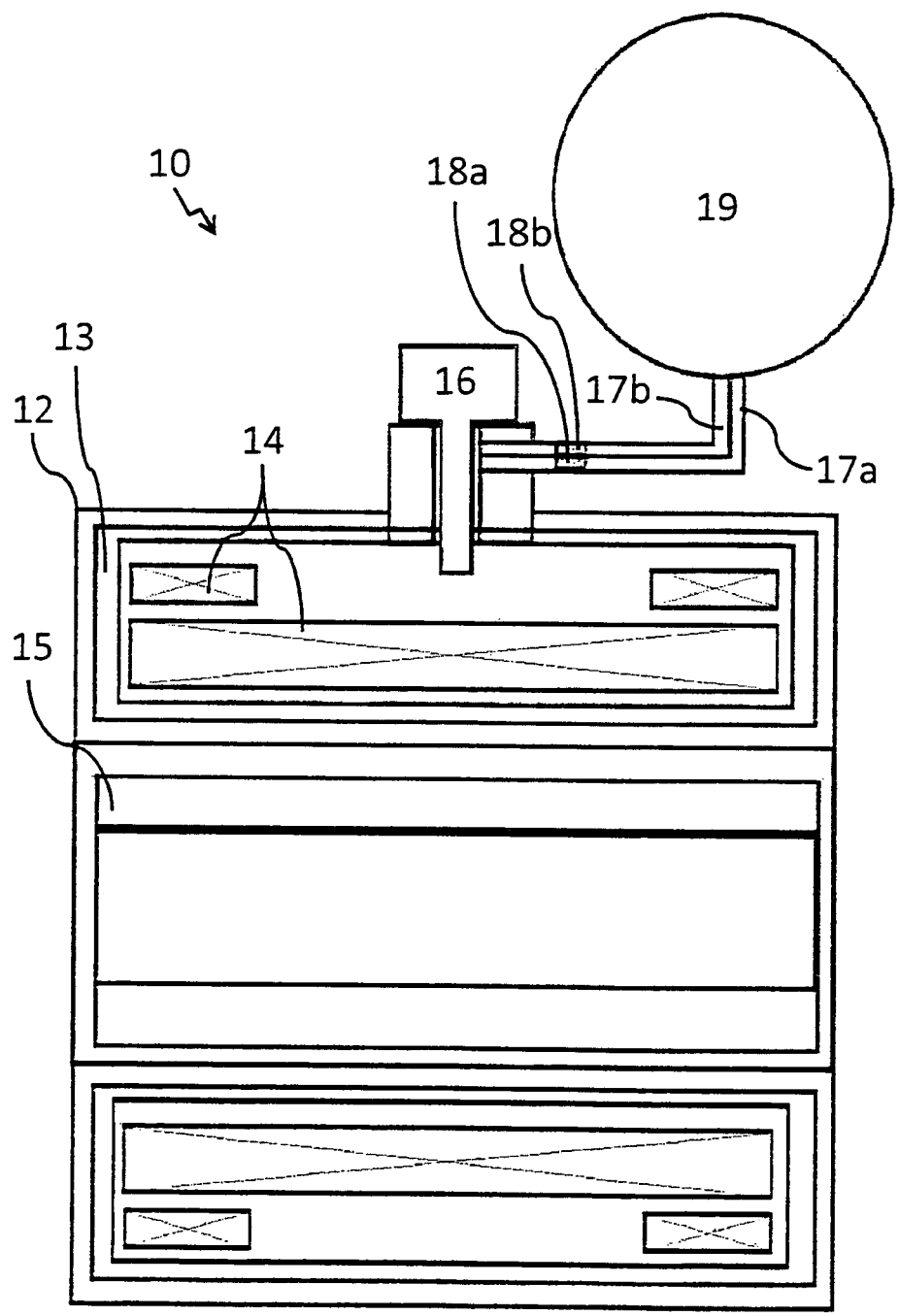
FIG. 1 shows a schematic view of an embodiment of the inventive NMR apparatus.

FIG. 1 shows a schematic view of an embodiment 10 of the inventive NMR apparatus, comprising a cryostat 12 which has a helium tank 13, a main field magnet coil system 14, a gradient coil system 15 and a refrigerator 16. Due to the high gradient strengths and slew rates, certain NMR measurements generate high heat input into the helium tank 13, thereby increasing the helium evaporation rate. In accordance with the invention, an evaporation line 17a guides evaporating helium into a buffer container 19. A return line 17b guides the helium from there to the refrigerator 16. The control valves 18a, 18b control the helium flow in such a fashion that, during measurement, the amount of helium that flows back is not larger than the amount that the refrigerator can re-liquify due to its capacity. After termination of the measurements, the collected helium is gradually re-liquified from the buffer container 19 via the refrigerator 16.

In order to ensure reasonable re-liquifaction of evaporated helium, the refrigerator 16 should have a capacity of at least 0.3 W above the dissipated power of the cryostat without gradient switching. This is the only way to minimize the quiescent phases in which the helium is re-liquified and the buffer container 19 is emptied. Smaller excess capacities would cause long downtimes and thereby obstruct operation.

The control valves 18a, 18b also prevent backflow of helium due to elasticity forces in buffer containers of elastic material.

Figure 2:
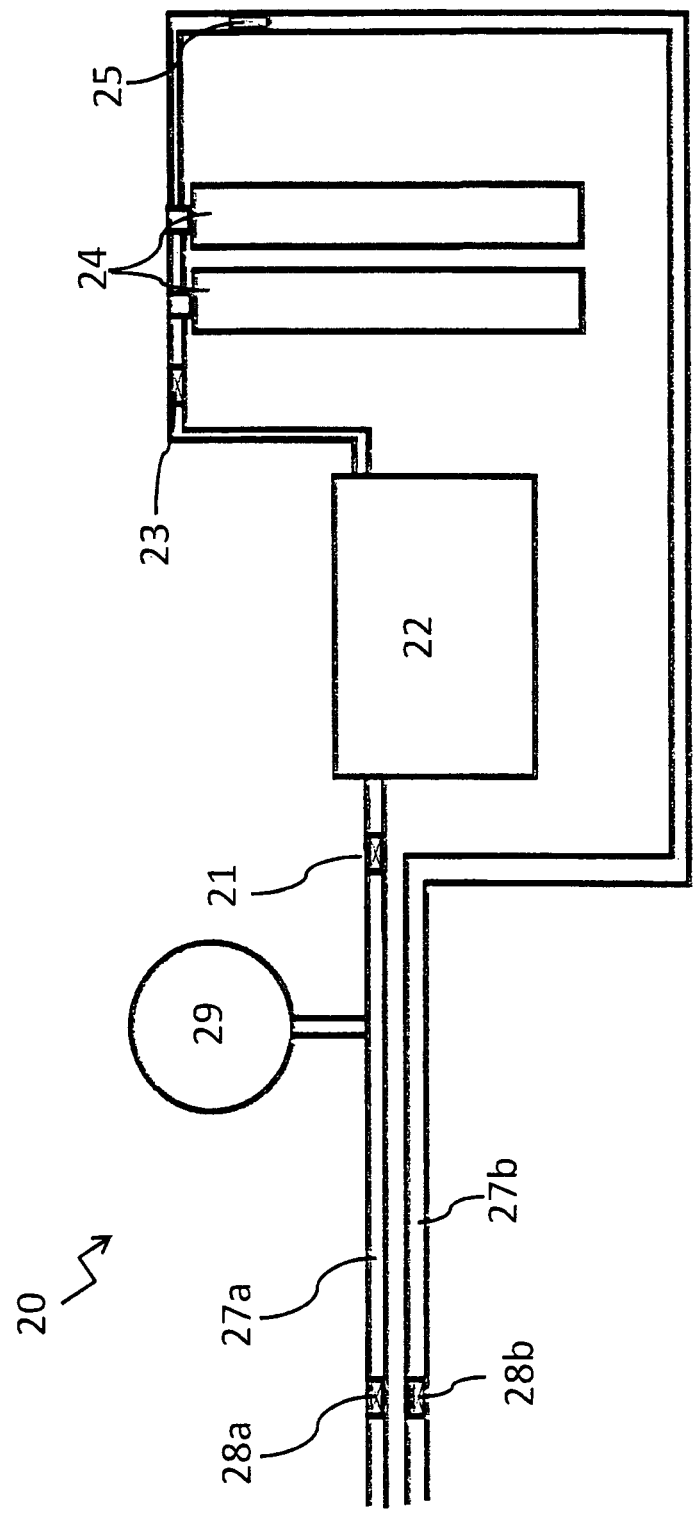
FIG. 2 shows part of a possible embodiment of the inventive NMR apparatus with an intermediate buffer container, compressor and gas bottles.

One part of an alternative embodiment 20 of the inventive NMR apparatus is illustrated in FIG. 2. The helium flows from the cryostat (not shown) via the evaporation line 27a to a buffer container 29. A compressor 22 condenses the evaporated helium and forces the helium gas into gas bottles 24. Control valves 21, 23, 25 regulate the inflow and outflow of helium to/from the compressor 22 and the gas bottles 24. The control valves 28a, 28b in the evaporation line 27a or return line 27b control the helium flow from/to the cryostat (not shown).

Figure 3:
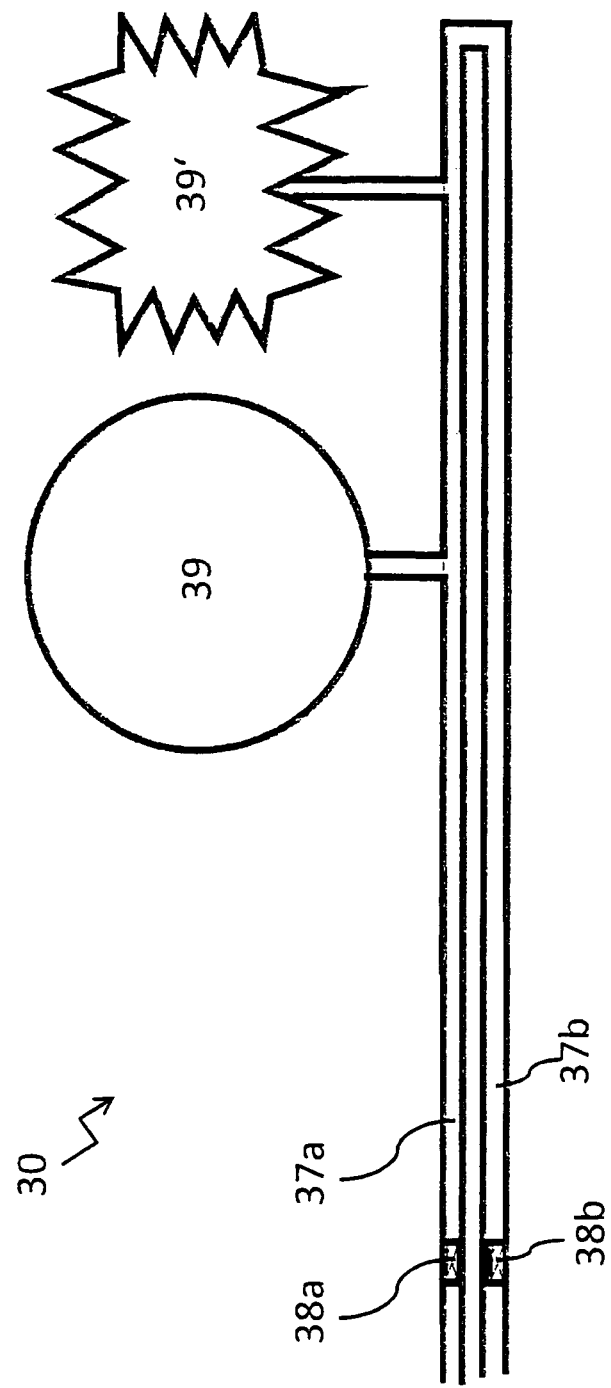
FIG. 3 shows part of a further possible embodiment of the inventive NMR apparatus with two alternative embodiments of the buffer container.

FIG. 3 shows a further part of an embodiment 30 of the inventive NMR apparatus with different buffer containers 39, 39'. The buffer container may thereby be designed as a balloon 39 or as a balloon of foldable material 39'. The control valves 38a, 38b thereby also control the inflow and respectively the backflow of helium via the evaporation line 37a and respectively the return line 37b.

LIST OF REFERENCE NUMERALS

10 NMR apparatus
12 cryostat
13 helium tank
14 main field magnet coil system
15 gradient coil system
16 refrigerator
17a evaporation line
17b return line
18a control valve for 7a
18b control valve for 7b
19 buffer container
20 NMR apparatus (section)
21 control valve feed line compressor
22 compressor
23 control valve feed line gas bottles
24 gas bottles
25 control valve discharge gas bottles
27a evaporation line
27b return line
28a control valve for 27a
28b control valve for 27b
29 intermediate buffer container
30 NMR apparatus (section)
37a evaporation line
37b return line
38a control valve for 37a
38b control valve for 37b
39 buffer container (balloon)
39' foldable buffer container

LITERATURE

1 US-Z. IEEE Transactions on applied superconductivity, Vol. 15, no. 2, 2005, pages 1317-1325
2 US-Z. IEEE Transactions on applied superconductivity, Vol. 10, no. 1, 2000, pages 744-751
3 U.S. Pat. No. 6,828,889
4 Cryocoolers 10, Proceedings of the 10th international Cryocooler Conference, held May 26-28, 1998 in Monterey.
5 DE69930472 T2 2006.12.14
6 US2008/0.157771 A1
7 U.S. Pat. No. 7,692,426 B2
8 US-Z. IEEE Transactions on magnetic, Vol. 41, no. 1, 2005

We claim:

1. A nuclear magnetic resonance (NMR) apparatus, the apparatus comprising:

a cryostat, said cryostat structured for holding and maintaining liquid helium;

a superconducting main field magnet coil system disposed in said cryostat, said magnet coil system generating a homogeneous magnetic field of at least 3T;

a gradient coil system, said gradient coil system generating a gradient strength of at least $10 \, \text{mTm}^{-1}$, with a slew rate of at least $100 \, \text{Tm}^{-1}\text{s}^{-1}$;

a refrigerator, a pulse tube cooler or a Gifford-McMahon cooler, wherein, in all states of operation of the NMR apparatus without gradient switching, said refrigerator provides a cooling capacity which is at least 0.3 W above an overall power loss (thermal input) of said cryostat;

a buffer container disposed outside of said cryostat;

an evaporation line connected between said cryostat and said buffer container for transporting helium evaporated from said cryostat to said buffer container; and a return line connected between said buffer container and said cryostat for returning evaporated helium, which has been collected in said buffer container, into said cryostat.

2. The NMR apparatus of claim 1, further comprising at least one evaporation valve for controlling helium flow through said evaporation line.

3. The NMR apparatus of claim 1, further comprising at least one return valve for controlling helium flow through said return line.

4. The NMR apparatus of claim 2, wherein said evaporation valve is designed as a control valve that can be driven.

5. The NMR apparatus of claim 3, wherein said return valve is designed as a control valve that can be driven.

6. The NMR apparatus of claim 1, wherein said return line is identical with said evaporation line.

7. The NMR apparatus of claim 1, wherein said return line has an end section on a cryostat side, which is in direct thermal contact with said refrigerator.

8. The NMR apparatus of claim 1, wherein said return line comprises at least one filter device for precipitating impurities in helium flow.

9. The NMR apparatus of claim 1, wherein said buffer container comprises a balloon for varying an internal volume thereof.

10. The NMR apparatus of claim 9, wherein said balloon is made from elastic material.

11. The NMR apparatus of claim 9, wherein said balloon is foldable.

12. The NMR apparatus of claim 1, wherein said buffer container comprises a gas bottle and a compressor.

13. The NMR apparatus of claim 1, wherein the NMR apparatus is an MRI or FTMS apparatus.

14. A method for operating the NMR apparatus of claim 1, the method comprising the steps of:

a) driving, in an operating state of the NMR apparatus with gradient switching, the gradient coil system in such a fashion that pulsed magnetic field gradients with repetition frequencies of at least 100 Hz, gradient strengths of at least $10\,\mathrm{mTm^{-1}}$ and slew rates of at least $100\,\mathrm{Tm^{-1}s^{-1}}$ are generated, thereby causing additional heat input into the cryostat of more than 0.3 W compared to operating states without gradient switching;

b) passing helium evaporated from the cryostat through the evaporation line for intermediate storage in the buffer container;

c) switching-off the gradient coils;

d) returning helium from the buffer container via the return line into the cryostat; and e) bringing the helium into thermal contact with cold surfaces of the refrigerator to thereby re-liquefy the helium.

15. The method of claim 14, wherein, when a first limit pressure p1 in the cryostat is exceeded, a valve in the evaporation line is opened and is closed again when a second limit pressure $p2 \leq p1$ is fallen below.

16. The method of claim 14, wherein EPI-, RARE- or FLASH-sequences are generated in an operating state with gradient switching.

17. A nuclear magnetic resonance (NMR) apparatus, the apparatus comprising:

a cryostat, said cryostat structured for holding and maintaining liquid helium;

a superconducting main field magnet coil system disposed in said cryostat, said magnet coil system generating a homogeneous magnetic field of at least 3T;

a gradient coil system, said gradient coil system generating a gradient strength of at least $10\,\mathrm{mTm^{-1}}$, with a slew rate of at least $100\,\mathrm{Tm^{-1}s^{-1}}$;

a refrigerator, a pulse tube cooler or a Gifford-McMahon cooler, said refrigerator having a cooling capacity which exceeds an overall power loss (thermal input) of said cryostat without gradient switching by an amount which is greater than or equal to an additional heat input into the cryostat caused by gradient switching;

a buffer container disposed outside of said cryostat;

an evaporation line connected between said cryostat and said buffer container for transporting helium evaporated from said cryostat to said buffer container; and a return line connected between said buffer container and said cryostat for returning evaporated helium, which has been collected in said buffer container, into said cryostat.

* * * * *